(12) United States Patent
Lee (10) Patent No.: US 7,833,902 B2
(45) Date of Patent: Nov. 16, 2010

(54) SEMICONDUCTOR DEVICE AND METHOD OF FABRICATING THE SAME

(75) Inventor: Jin-won Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 498 days.

(21) Appl. No.: 11/903,575

(22) Filed: Sep. 24, 2007

(65) Prior Publication Data

US 2008/0093741 A1  Apr. 24, 2008

(30) Foreign Application Priority Data

Oct. 20, 2006 (KR) .................... 10-2006-0102443

(51) Int. Cl.
*H01L 23/52* (2006.01)
*H01L 21/4763* (2006.01)
(52) U.S. Cl. ............... 438/647; 257/755; 257/E23.141; 257/E21.495
(58) Field of Classification Search ................ 438/253, 438/239, 647; 257/755, E23.141, E21.495
See application file for complete search history.

(56) References Cited

U.S. PATENT DOCUMENTS 6,489,197 B2 * 12/2002 Uchiyama .................. 438/253
7,297,998 B2   11/2007 Kim et al.

2005/0202630 A1 * 9/2005 Tran ........................... 438/253
2006/0202340 A1   9/2006 Park et al.
2006/0205141 A1 * 9/2006 Park et al. .................... 438/239

FOREIGN PATENT DOCUMENTS

| JP | 2001-257325 | 9/2001 |
| KR | 1020010058958 A | 7/2001 |
| KR | 1020030046135 A | 6/2003 |
| KR | 10-2004-0067315 | 7/2004 |
| KR | 1020050012956 A | 2/2005 |
| KR | 10-2005-0101037 | 12/2005 |

* cited by examiner

*Primary Examiner*—David Vu
*Assistant Examiner*—Jonathan Han
(74) *Attorney, Agent, or Firm*—Mills & Onello, LLP

(57) ABSTRACT

In a semiconductor device and a method of fabricating the same, the semiconductor device includes a contact pad in a first interlayer insulating layer on a semiconductor substrate, a contact hole in a second interlayer insulating layer on the first interlayer insulating layer, selectively exposing the contact pad, a contact spacer on internal walls of the contact hole, a first contact plug connected to the contact pad exposed by the contact hole having the contact spacer on the internal walls thereof, the first contact plug partially filling the contact hole, a metal silicide layer on a surface of the first contact plug, and a second contact plug on the metal silicide layer and partially filling the remaining portion of the contact hole.

14 Claims, 11 Drawing Sheets

SEMICONDUCTOR DEVICE AND METHOD OF FABRICATING THE SAME

CROSS-REFERENCE TO RELATED APPLICATION

This application claims priority from Korean Patent Application No. 10-2006-0102443 filed on Oct. 20, 2006 in the Korean Intellectual Property Office, the disclosure of which is incorporated herein by reference in its entirety.

BACKGROUND OF THE INVENTION

1. Field of the Invention

The present invention relates to a semiconductor device and a method of fabricating the same, and more particularly, to a semiconductor device which can prevent electrical contact failures, and a method of fabricating the same.

2. Description of the Related Art

Higher integration in semiconductor devices has resulted in a decrease in the size of a contact hole that connects one element or layer to another element or layer, while resulting in an increase in the relative thickness of an interlayer insulating layer. Thus, the aspect ratio of the contact hole increases, and an alignment margin of the contact hole decreases, in a photolithography process. As a result, forming small contact holes using conventional techniques becomes increasingly difficult with further integration of semiconductor devices.

Accordingly, the size of a buried contact (BC), which is a contact for forming a storage node, has also decreased. In this regard, several problems may be presented. For example, the size of the contact hole gradually decreases at the region of contact with the lower interconnection line, or the formation of contact holes using a photolithography process in highly integrated semiconductor devices can lead to unreliable results. In this regard, after forming the contact hole for extending the width of the buried contact (BC), extending of the contact hole can be completed by performing a wet etch process thereon.

Meanwhile, as the integration of semiconductor devices increases, the size of a bit line used in memory devices becomes further reduced, and a margin for insulating an underlying pad becomes insufficient during the wet etch process performed for the purpose of increasing the size of the buried contact, thereby increasing the likelihood of partial exposure of an adjacent pad. Accordingly, an etching solution may penetrate through a direct contact (DC) that electrically connects the bit line to an underlying contact pad, so that a conductive material can become erroneously etched. In particular, a silicide layer formed at an interface between the contact pad and the direct contact (DC) can become easily damaged by an etching solution.

Therefore, the direct contact (DC) of the underlying bit line may be partially filled with an insulating material or a conductive material of a buried contact (BC) in a subsequent process, thereby resulting in unwanted electrical contact failures in the manufacture of semiconductor devices.

SUMMARY OF THE INVENTION

Embodiments of the present invention provide a semiconductor device which can prevent electrical contact failures.

Embodiments of the present invention also provide a method of fabricating a semiconductor device which can prevent electrical contact failures.

These and other objects of the embodiments of the present invention will be described in or be apparent from the following description of the preferred embodiments.

In a first aspect, a semiconductor device comprises: a contact pad in a first interlayer insulating layer on a semiconductor substrate; a contact hole in a second interlayer insulating layer on the first interlayer insulating layer, selectively exposing the contact pad; a contact spacer on internal walls of the contact hole; a first contact plug connected to the contact pad exposed by the contact hole having the contact spacer on the internal walls thereof, the first contact plug partially filling the contact hole; a metal silicide layer formed on a surface of the first contact plug; and a second contact plug formed on the metal silicide layer and partially filling the remaining portion of the contact hole.

In one embodiment, the first contact plug comprises doped polysilicon.

In another embodiment, the first contact plug is formed by a selective epitaxial growth (SEG) process.

In another embodiment, the first contact plug fills at least 5% of the bit line contact hole.

In another embodiment, the first contact plug has a thickness in a range of about 100 to about 1500 Å.

In another embodiment, the second contact plug comprises a metal layer.

In another embodiment, the second contact plug comprises a nitride layer.

In another embodiment, the semiconductor device further comprises an outer spacer surrounding external walls of an upper portion of the contact pad.

In another aspect, a method of fabricating a semiconductor device comprises: forming a contact pad formed in a first interlayer insulating layer on a semiconductor substrate; forming a second interlayer insulating layer on the first interlayer insulating layer; forming a contact hole on the second interlayer insulating layer, the contact hole selectively exposing the contact pad; forming a contact spacer on internal walls of the contact hole; forming a first contact plug connected to the contact pad exposed by the contact hole having the contact spacer formed on the internal walls thereof, the first contact plug partially filling the contact hole; forming a metal silicide layer on a surface of the first contact plug; and forming a second contact plug formed on the metal silicide layer and partially filling the remaining portion of the contact hole.

In one embodiment, forming the first contact plug comprises performing a selective epitaxial growth (SEG) process on the contact pad exposed by the contact hole having the contact spacer formed on the internal walls thereof.

In another embodiment, forming the first contact plug comprises filling at least 5% of the contact hold.

In another embodiment, the first contact plug is formed to a thickness in a range of about 100 to about 1500 Å.

In another embodiment, the first contact plug is formed of doped polysilicon.

In another embodiment, forming the first contact plug comprises: forming a conductive layer on the second interlayer insulating layer, the conductive layer filling the contact hole having the contact spacer formed on internal walls thereof; and etching a portion of the conductive layer to allow the portion of the conductive layer to remain in the contact hole having the contact spacer.

In another embodiment, the etching of the portion of the conductive layer comprises performing an anisotropic etching on the conductive layer.

In another embodiment, forming the first contact plug comprises allowing at least 5% of the conductive layer to remain in the contact hole.

In another embodiment, the first contact plug is formed to a thickness in a range of about 100 to about 1500 Å.

In another embodiment, the first contact plug is formed of doped polysilicon.

In another embodiment, forming the metal silicide layer comprises: forming a metal barrier layer conformally along the contact hole on the first contact plug; and performing an annealing process to form the metal silicide layer.

In another embodiment, forming the second contact plug comprises burying a metal layer on the metal silicide layer.

In another embodiment, the contact spacer is formed of a nitride layer.

In another embodiment, after forming the contact pad, the method further comprises forming an outer spacer surrounding external walls of an upper portion of the contact pad.

BRIEF DESCRIPTION OF THE DRAWINGS

The above and other features and advantages of the embodiments of the present invention will become more apparent by describing in detail preferred embodiments thereof with reference to the attached drawings in which:

FIGS. 3 through 14 are cross-sectional views sequentially illustrating the steps of a fabricating method of the semiconductor device shown in FIG. 1.

DETAILED DESCRIPTION OF EMBODIMENTS OF THE INVENTION

Advantages and features of the embodiments of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete, and the embodiments of the present invention will only be defined by the appended claims. Like reference numerals refer to like elements throughout the specification.

The present invention now will be described more fully hereinafter with reference to the accompanying drawings, in which preferred embodiments are shown.

A structure of a semiconductor device according to an embodiment of the present invention will now be described with reference to FIGS. 1 and 2.

Figure 1:
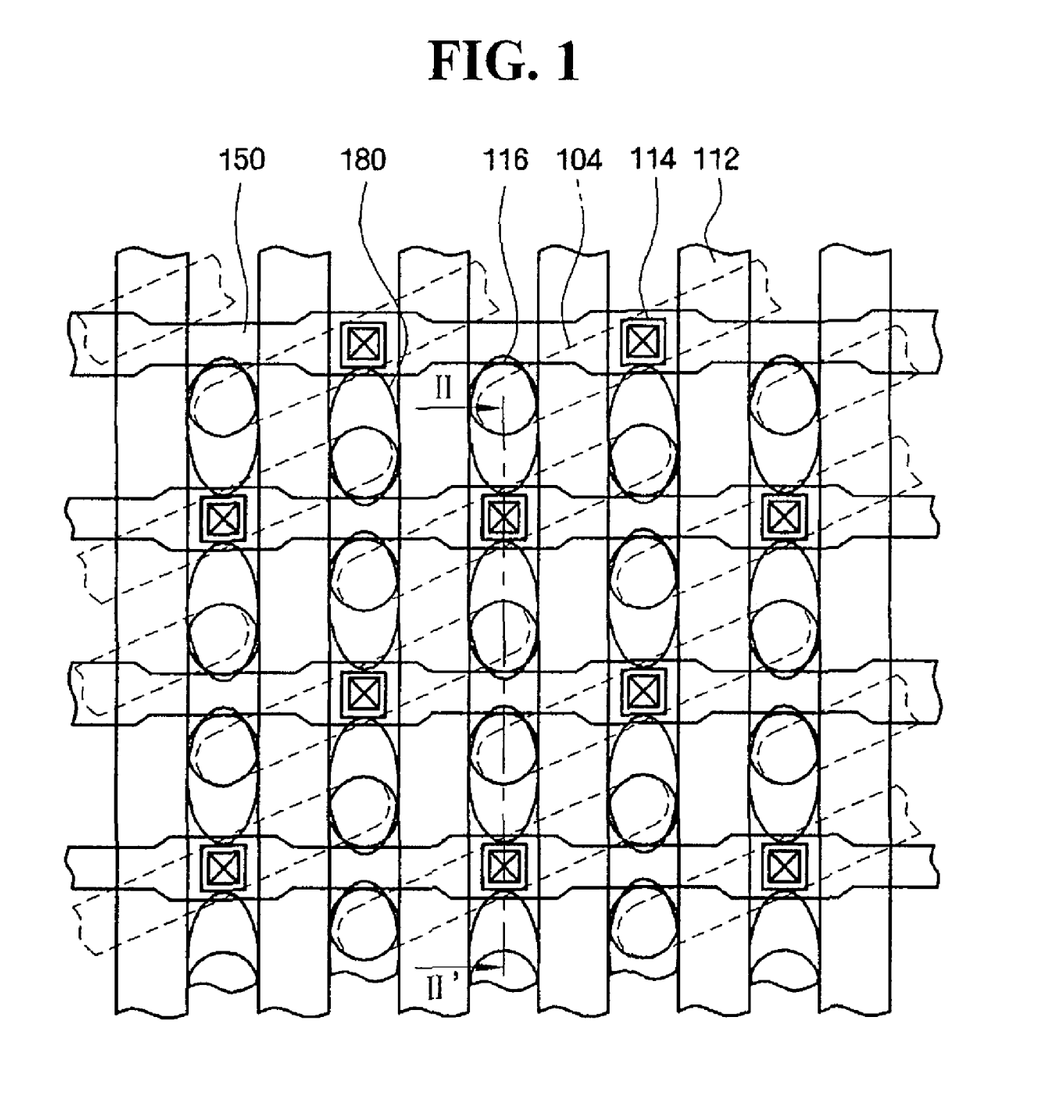
FIG. 1 is a layout view of a semiconductor device according to an embodiment of the present invention.
Figure 2:
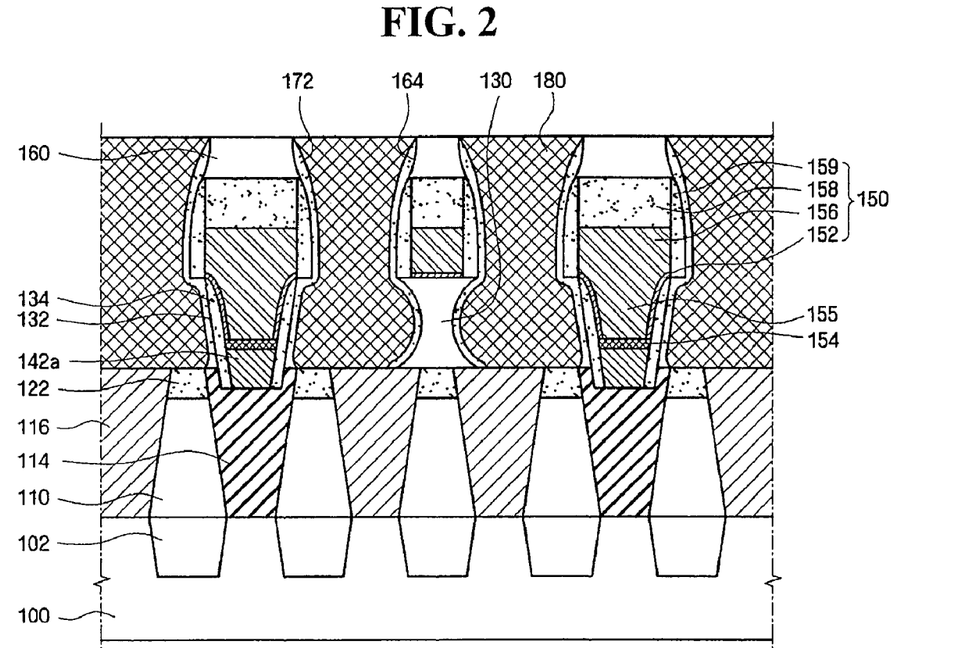
FIG. 2 is a cross-sectional view of the semiconductor device shown in FIG. 1 taken along the section line II-II'.

FIG. 1 is a layout view of a semiconductor device according to an embodiment of the present invention, and FIG. 2 is a cross-sectional view of the semiconductor device shown in FIG. 1 taken along the section line II-II'.

As shown in FIGS. 1 and 2, a semiconductor substrate 100 includes active regions 104 defined by isolation films 102, and a plurality of gate lines 112 extending in one direction are disposed on the semiconductor substrate 100. Impurity regions (not shown) are formed in the active regions 104 at both sides of each of the gate lines 112.

A first interlayer insulating layer 110 is formed on the gate lines 112, and contact pads 114 and 116 are formed in the first interlayer insulating layer 110 between the gate lines 112. The contact pads 114 and 116 are formed, for example, of a conductive material such as polysilicon, or a metallic material. The contact pads 114 and 116 may be in the form of self-aligned contact (SAC) pads with respect to the gate lines 112.

The contact pads can be for example, a bit line contact pad 114 electrically connected to an upper bit line 150 and a storage node contact pad 116 electrically connected to an upper storage node (not shown). Outer spacers 122 enclosing outer walls of upper portions of the contact pads 114 and 116, are formed on the first interlayer insulating layer 110 between the contact pads 114 and 116. The outer spacers 122 may be formed of silicon nitride (SiN) or silicon oxynitride (SiON). The outer spacers 122 can prevent external sidewalls of the contact pads 114 and 116 from being exposed in a subsequent process.

A second interlayer insulating layer 130 is formed on the contact pads 114 and 116 and the outer spacer 122. The second interlayer insulating layer 130 includes a bit line contact hole 132 exposing the bit line contact pad 114. As shown, the bit line contact hole 132 may be recessed into the bit line contact pad 114 to a predetermined depth.

A bit line contact spacer 134 is formed on internal walls of the bit line contact hole 132. The bit line contact spacer 134 may be formed using nitride.

A first bit line contact plug 142a, which fills a portion of the bit line contact hole 132, is formed on the bit line contact pad 114 exposed by the bit line contact hole 132 having the bit line contact spacer 134 formed on its internal walls.

In greater detail, in order to prevent a metal silicide layer 154 formed on a surface of the first bit line contact plug 142a from being damaged in a subsequent process, a top surface of the first bit line contact plug 142a should be positioned at a level that is higher than a top surface of the underlying contact pads 114 and 116. Accordingly, the first bit line contact plug 142a is preferably formed so as to partially fill the bit line contact hole 132, e.g., about 5% or more of the bit line contact hole 132.

In addition, the first bit line contact plug 142a can further prevent the metal silicide layer 154 from deviating from the bit line contact hole 132 during formation of the metal silicide layer 154. In other words, the first bit line contact plug 142a may be formed so as to completely fill the bit line contact hole 132.

Accordingly, the first bit line contact plug 142a may have a thickness in a range of about 100 to about 1500 Å. In addition, the first bit line contact plug 142a may be made of doped polysilicon.

A second bit line contact plug 155, which fills the remaining portions the bit line contact hole 132, is formed on the first bit line contact plug 142a.

In order to prevent diffusion of a metallic material or in order to reduce contact resistance, the second bit line contact plug 155 may be formed as a metal layer, and a metal barrier layer 152 is formed under the second bit line contact plug 155. The metal layer forming the second bit line contact plug 155 may be made of, for example, tungsten (W), copper (Cu), aluminum (Al), or the like. The metal barrier layer 152 positioned under the metal layer, i.e., the second bit line contact plug 155, may be formed of at least one material selected from Ta, TaN, TaSiN, Ti, TiN, TiSiN, W, WN, or a combination of these materials. Specifically, a Ti/TiN layer is typically used as the metal barrier layer 152 and a W layer is typically used as the metal layer.

In such a manner, the metal silicide layer 154 is formed at an interface between the first and second bit line contact plugs 142a and 155. Since the metal barrier layer 152 is typically formed as a Ti/TiN layer, the metal silicide layer 154 may be formed as a TiSix layer.

Accordingly, a top surface of the metal silicide layer 154 is formed to be positioned at a level that is higher than that of the contact pad 114, 116 formed around the metal silicide layer 154. In addition, the metal silicide layer 154 is surrounded by the bit line contact spacer 134 and is positioned in the middle of the bit line contact hole 132. Thus, the metal silicide layer 154 can be prevented from being damaged during subsequent fabrication processes.

A plurality of bit lines 150 are positioned on the second interlayer insulating layer 130, the plurality of bit lines 150 being electrically connected to the second bit line contact plug 155 and extending in a direction perpendicular to the underlying gate lines 112. Each of the plurality of bit lines 150 includes a stack of a bit line conductive layer 156 and a bit line capping layer 158. A bit line spacer 159 is formed on sidewalls of the bit line conductive layer 156 and the capping layer 158. Here, the bit line conductive layer 156 may be formed of the same material as the underlying second bit line contact plug 155. The metal barrier layer 152 is disposed at a lower portion of the bit line conductive layer 156 formed on the second interlayer insulating layer 130.

A third interlayer insulating layer 160 is positioned on the bit lines 150. A storage node expanded contact hole 164, which exposes the underlying storage node contact pad 116, is formed through the second and third interlayer insulating layers 130 and 160. The storage node expanded contact hole 164 is formed so as to extend an exposed area of the storage node contact pad 116. That is to say, the storage node expanded contact hole 164 is capable of exposing an area ranging from the storage node contact pad 116 to the bit line contact spacer 134 through the second and third interlayer insulating layers 130 and 160. Here, the metal silicide layer 154 is not exposed by the storage node expanded contact hole 164 because it is surrounded by the bit line contact spacer 134 and is positioned in the middle of the bit line contact hole 132.

A storage node contact spacer 172 is formed on internal walls of the storage node expanded contact hole 164, and the storage node contact plug 180 made of a conductive material is formed in the storage node expanded contact hole 164. As described above, since the storage node contact plug 180 is formed within the storage node expanded contact hole 164, the contact area between the storage node contact plug 180 and the storage node contact pad 116 increases. The storage node contact spacer 172 can prevent a bridge phenomenon from occurring between neighboring storage node contact plugs 180.

Hereinafter, a method of fabricating the semiconductor device according to an embodiment of the present invention will be described with reference to FIGS. 1, and 3 through 13, together with FIG. 2. FIGS. 3 through 14 are cross-sectional views sequentially illustrating the steps of a fabricating method of a semiconductor device of the type shown in FIG. 1.

Figure 3:
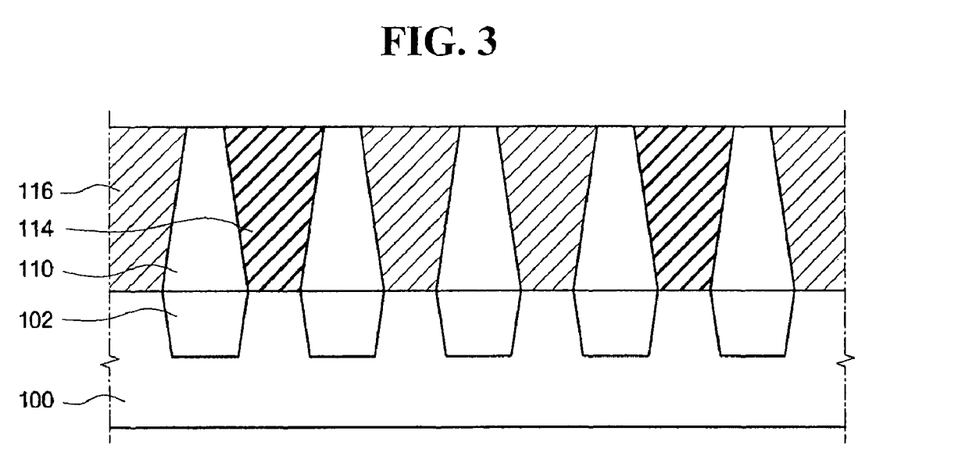

Referring first to FIG. 3, an isolation film 102 is formed on a semiconductor substrate 100 using a local oxidation of silicon (LOCOS) process or a shallow trench isolation (STI) process to define an active region 104 (see FIG. 1) in the semiconductor substrate 100.

The gate lines 112 (see FIG. 1), which extend in one direction across the active region 104 defined on the semiconductor substrate 100, are formed on the semiconductor substrate 100.

An insulation material is deposited on an entire surface of the semiconductor substrate 100 having the gate lines 112 and an upper portion of the surface of the semiconductor substrate 100 is planarized using a chemical-mechanical polishing (CMP) process or an etch-back process, thereby forming the first interlayer insulating layer 110. The first interlayer insulating layer 110 may be formed of silicon oxide.

Next, the first interlayer insulating layer 110 is etched using a general photolithography process to form contact holes exposing impurity regions (not shown) in the semiconductor substrate 100. When the contact holes are formed by etching the first interlayer insulating layer 110 using an etching gas having a high etching selectivity with respect to the gate lines 112, the contact holes are self-aligned to the gate lines 112 and the impurity regions (not shown) formed in the semiconductor substrate 100 are exposed.

Then, a conductive material such as polysilicon highly doped with impurities, or a metallic material, is deposited on an entire surface of the semiconductor substrate 100 having the contact holes to form a conductive layer filling the contact holes. Subsequently, an upper portion of the conductive layer is planarized to expose an upper portion of the first interlayer insulating layer 110, thereby forming self-aligned contact (SAC) pads 114 and 116 in the first interlayer insulating layer 110. The SAC pads 114 and 116 may be divided into the bit line contact pad 114 and the storage node contact pad 116.

Figure 4:
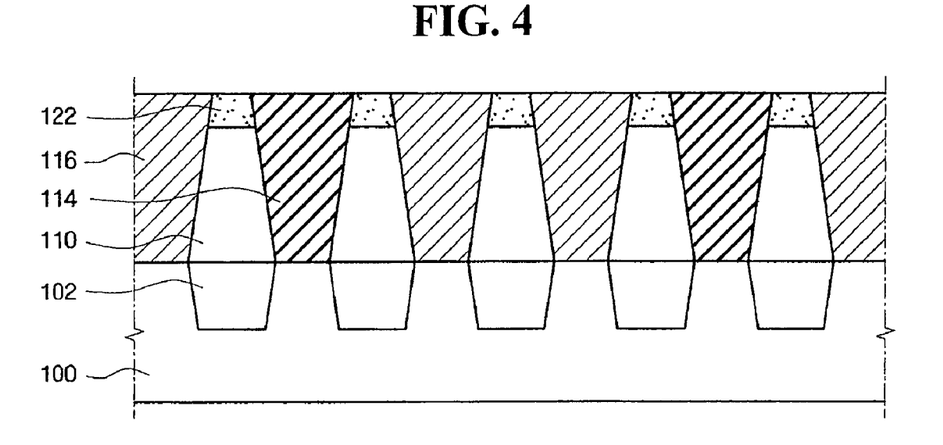

Next, as shown in FIG. 4, a portion of the first interlayer insulating layer 110 is recessed to form the outer spacer 122 surrounding outer walls of the upper portions of the contact pads 114 and 116.

In greater detail, an upper portion of the first interlayer insulating layer 110 is partially etched to recess the first interlayer insulating layer 110. Here, the first interlayer insulating layer 110 may be etched so as to be recessed from a top surface of the contact pads 114 and 116 by a predetermined depth of about 500 to about 600 Å. Accordingly, the contact pads 114 and 116 protrude from the top surface of the first interlayer insulating layer 110, and the outer walls of the upper portions of the contact pads 114 and 116 are partially exposed.

Thereafter, a nitride layer is deposited on the first interlayer insulating layer 110 and the contact pads 114 and 116 to a predetermined thickness. The nitride layer may be made of e.g., silicon nitride (SiN) or silicon oxynitride (SiON). Then, the nitride layer is anisotropically etched until the contact pads 114 and 116 are exposed, thereby forming the outer spacer 122 covering a recessed portion of the first interlayer insulating layer 110 between the contact pads 114 and 116 and surrounding the outer walls of the contact pads 114 and 116 protruding from the top surface of the first interlayer insulating layer. The outer spacer 122 may be formed by planarizing the nitride layer using a CMP process. Accordingly, the outer spacer 122 can protect the outer walls of the upper portions of the contact pads 114 and 116 during subsequent processes.

Figure 5:
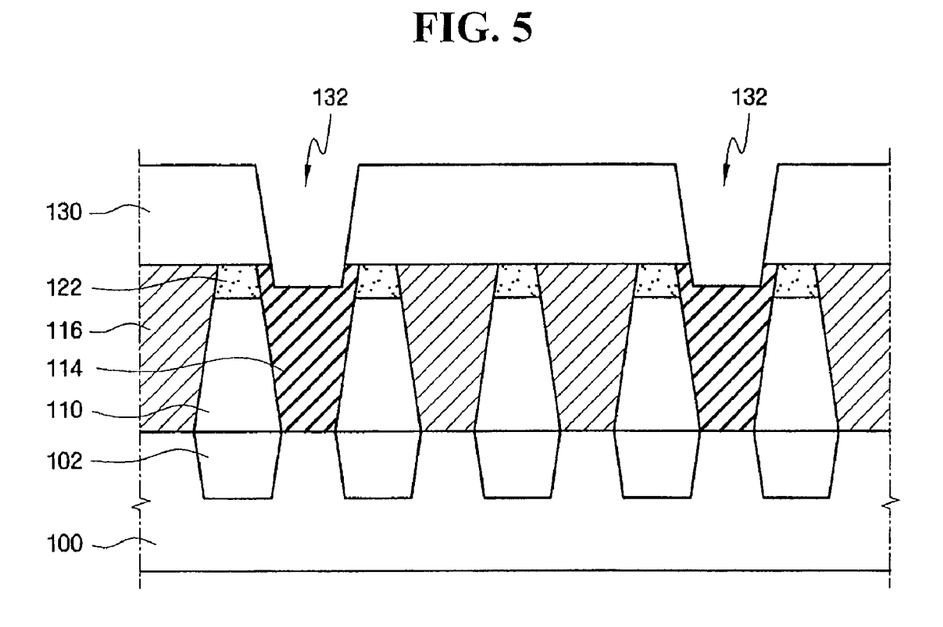

Next, as shown in FIG. 5, an insulating material is deposited on a surface of the outer spacer 122 and the contact pads 114 and 116 to form the second interlayer insulating layer 130. Examples of the insulating material include silicon oxide based materials selected from the group consisting of borosilicate glass (BSG), phosphorous silicate glass (PSG), borophosphorous silicate glass (BPSG), plasma enhanced tetraethyl orthosilicate (PE-TEOS), high density plasma (HDP) oxide, and the like.

Thereafter, the second interlayer insulating layer 130 is etched using a general photolithography process to form the bit line contact hole 132 exposing the underlying bit line contact pad 114. Here, the bit line contact hole 132 is recessed into the bit line contact pad 114 by performing etching until a portion of the bit line contact pad 114 is etched.

Figure 6:
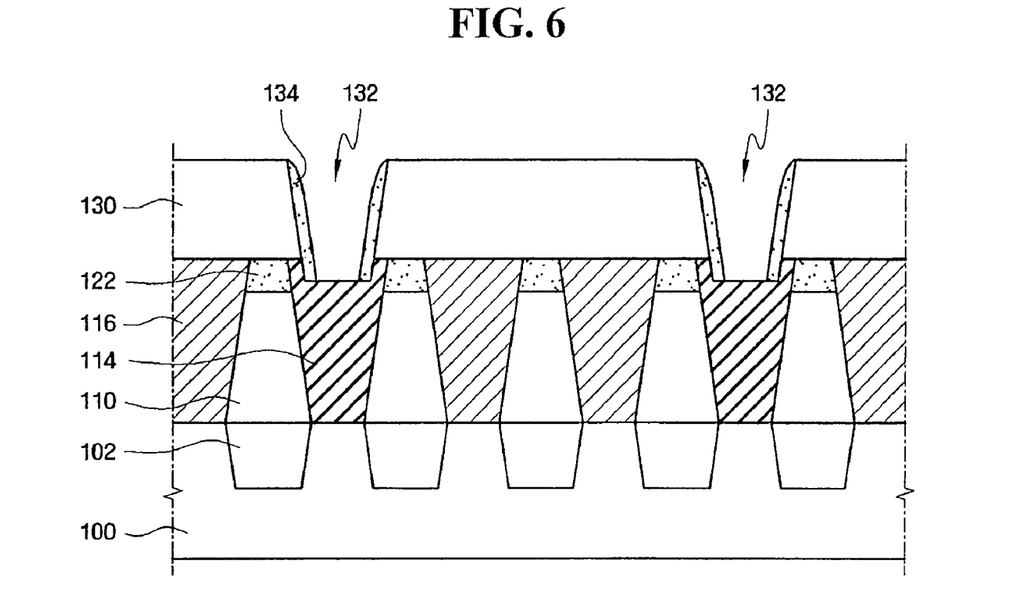

As shown in FIG. 6, a spacer nitride layer is deposited on an entire surface of the resultant structure having the bit line contact hole 136. The spacer nitride layer is formed by depositing silicon nitride (SiN) to a thickness of about 100 to about 300 Å. Thereafter, an etch-back process is performed on the spacer nitride layer to form the bit line contact spacer 134 on the internal walls of the bit line contact hole 136.

Figure 7:
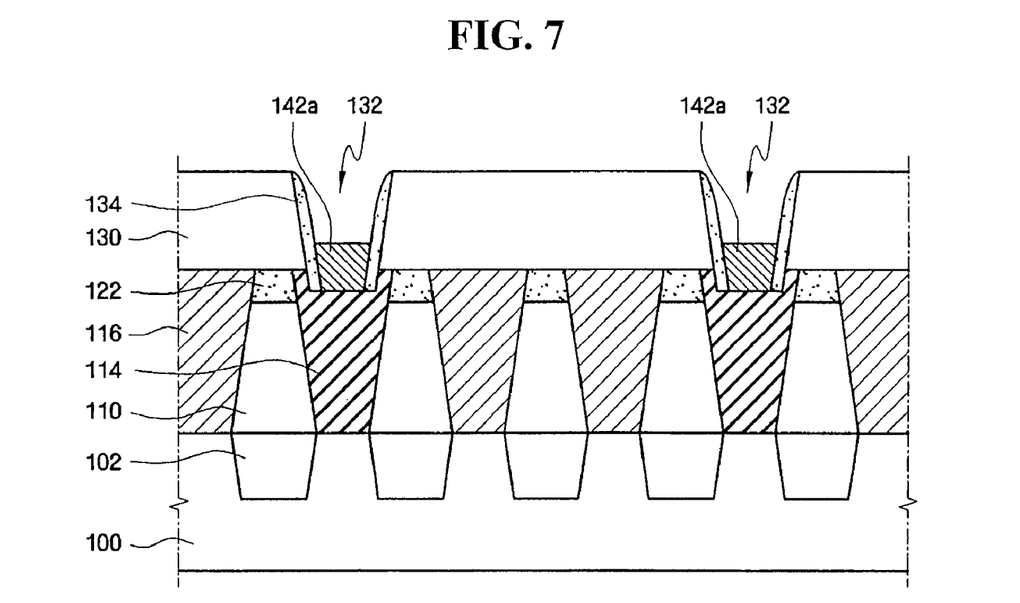

As shown in FIG. 7, a conductive material is deposited on the bit line contact hole 136 to fill the same, thereby forming the first bit line contact plug 142a.

In more detail, in order to prevent the metal silicide layer 154 (see FIG. 2 above) from being damaged in subsequent processes, the top surface of the first bit line contact plug 142a should be positioned at a higher level than the top surfaces of the underlying contact pads 114 and 116. For example, the first bit line contact plug 142a is formed so as to partially fill the bit line contact hole 132, e.g., about 5% or more of the bit line contact hole 132.

In the course of forming the metal silicide layer 154, in order to prevent the metal silicide layer 154 from deviating from the bit line contact hole 132, the first bit line contact plug 142a may be provided. In other words, the first bit line contact plug 142a may optionally be formed so as to completely fill the bit line contact hole 132.

Accordingly, the first bit line contact plug 142a may have a thickness in a range of about 100 to about 1500 Å. In addition, the first bit line contact plug 142a may be made of doped polysilicon.

The first bit line contact plug 142a may be formed of a conductive material to be positioned on the bit line contact pad 114 to then be electrically connected with the bit line contact pad 114.

In greater detail, as shown in FIG. 7, the first bit line contact plug 142a may be formed by performing a selective epitaxial growth (SEG) process. Here, since the bit line contact pad 114 exposed by the bit line contact hole 132 is formed of doped polysilicon, a doped polysilicon layer is grown on the bit line contact pad 114.

During the SEG process, in order to allow the top surface of the first bit line contact plug 142a to be formed at a level that is higher than that of the bit line contact pads 114 and 116, the doped polysilicon layer is preferably grown by at least 5% of the bit line contact hole 132. In addition, in order to prevent the metal silicide layer 154 formed in the subsequent process from deviating from the bit line contact hole 132, the doped polysilicon layer is grown within the bit line contact hole 132.

The first bit line contact plug 142a may be formed to a thickness ranging from about 100 to about 500 Å.

Figure 8A:
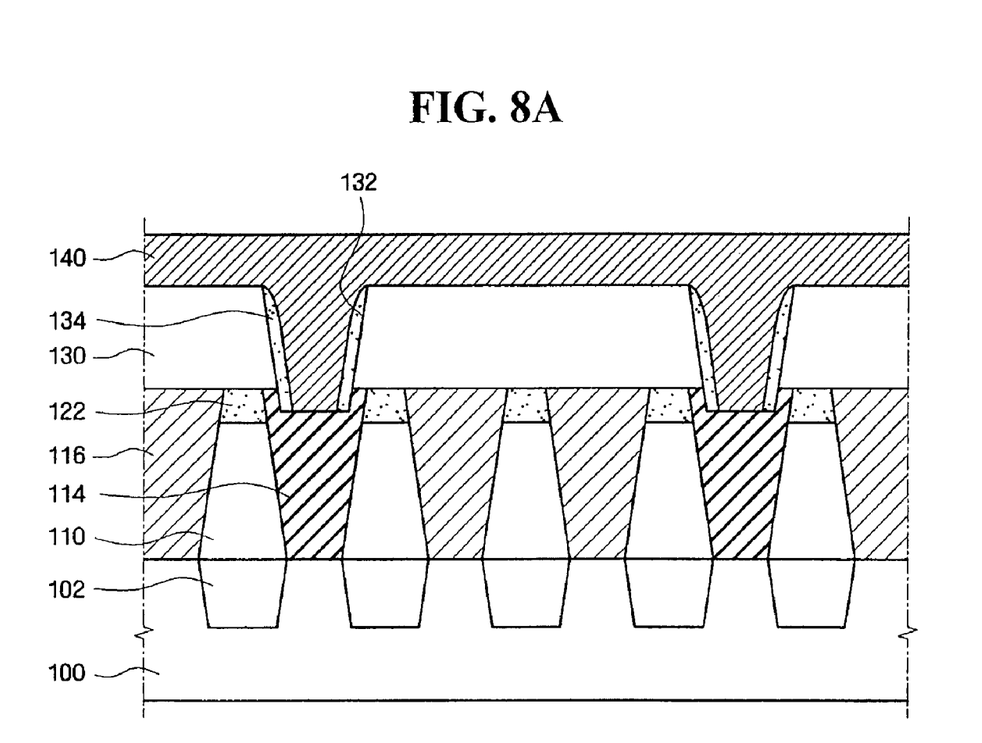
Figure 8B:
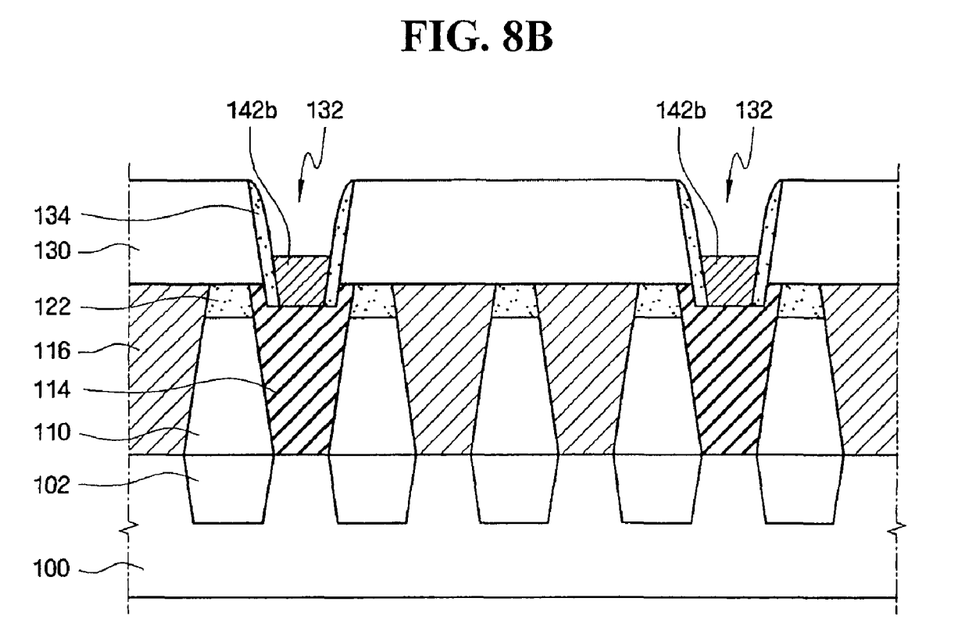

In a modified embodiment of the present invention, the first bit line contact plug 142a may optionally be formed by a fabrication method as shown in FIGS. 8A and 8B.

Referring to FIG. 8A, a conductive layer 140 filling the bit line contact hole 132 is formed on the entire surface of the second interlayer insulating layer 130 having the bit line contact hole 132. Here, the conductive layer 140 may be formed by depositing a doped polysilicon, like in the underlying bit line contact pad 114.

Then, the conductive layer 140 is partially etched so that the remaining portion fills a portion of the bit line contact hole 132, thereby forming a first bit line contact plug 142b. Here, the portion of the conductive layer 140 is anisotropically etched so as to allow at least 5% of the conductive layer 140 to remain in the bit line contact hole 132. For example, the first bit line contact plug 142b may be formed to a thickness ranging from about 100 to about 500 Å.

In the foregoing description, the methods of forming modified examples of the first bit line contact plug, i.e., 142a and 142b, have been described with reference to FIGS. 7, 8A and 8B. Hereinafter, processes subsequent to the forming of the first bit line contact plugs 142a and 142b will be described.

Figure 9:
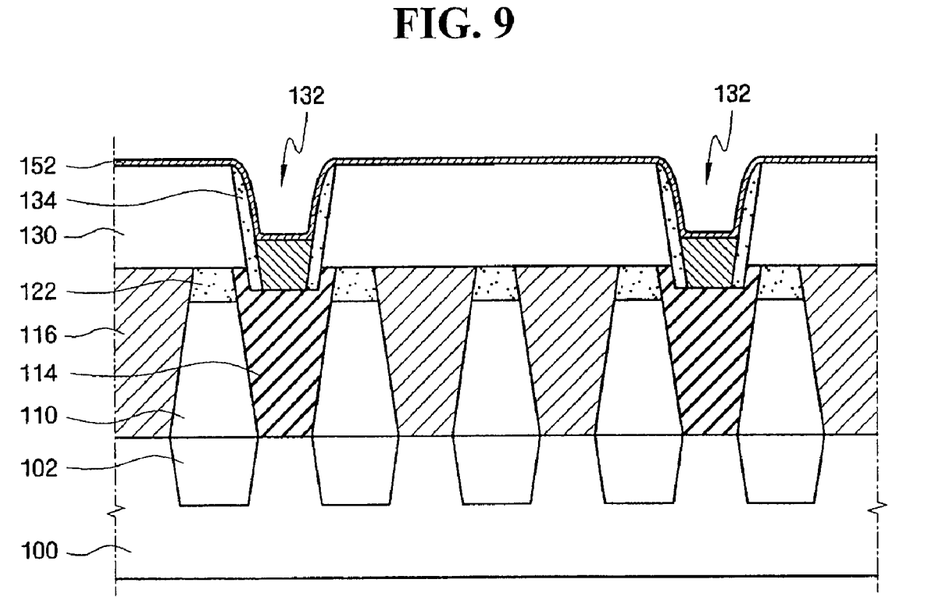

As shown in FIG. 9, a metal barrier layer 152 is formed conformally on the surface of the bit line contact hole 132 having the first bit line contact plug 142a and the second interlayer insulating layer 130. The metal barrier layer 152 is formed for the purpose of prevent diffusion of a metallic material or reduce contact resistance prior to formation of a metal layer to be formed thereon in a subsequent process. The metal barrier layer 152 may be formed of at least one material selected from Ta, TaN, TaSiN, Ti, TiN, TiSiN, W, WN, or a combination of these materials.

Figure 10:
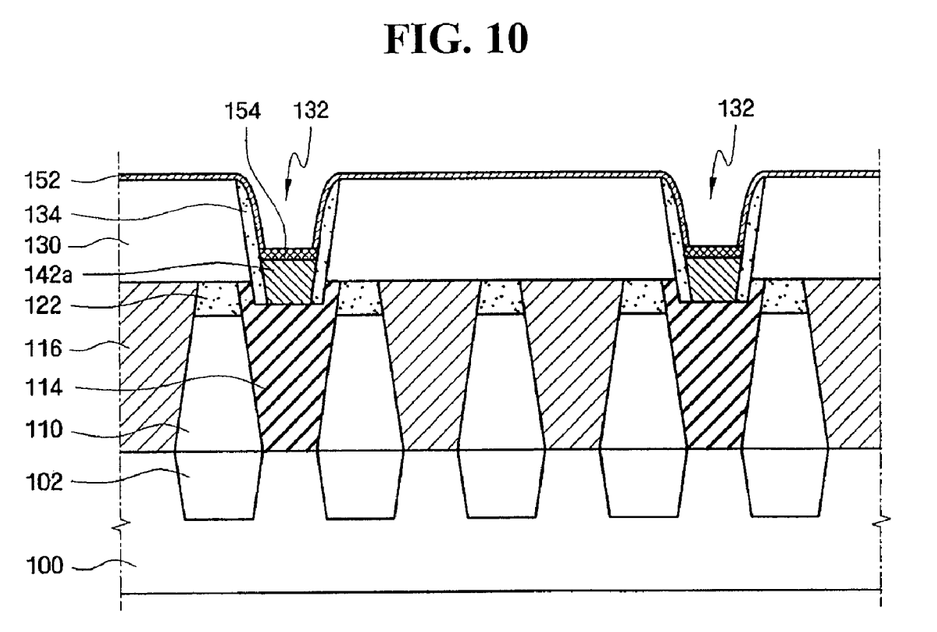

After forming the metal barrier layer 152, an annealing process is performed to improve adhesion between the metal barrier layer 152 and the overlying metal layer. That is, as shown in FIG. 10, the metal silicide layer 154 is formed by a reaction between a silicon composition and a metallic material, the reaction occurring at an interface between the metal barrier layer 152 and the first bit line contact plug 142a.

Since the metal silicide layer 154 is formed at the interface between the metal barrier layer 152 and the first bit line contact plug 142a, it is separated from the bit line contact pad 114. In addition, since the metal silicide layer 154 is surrounded by the bit line contact spacer 134, the metal silicide layer 154 can be fully protected from subsequent fabrication processes, for example, a subsequent wet etching process.

Figure 11:
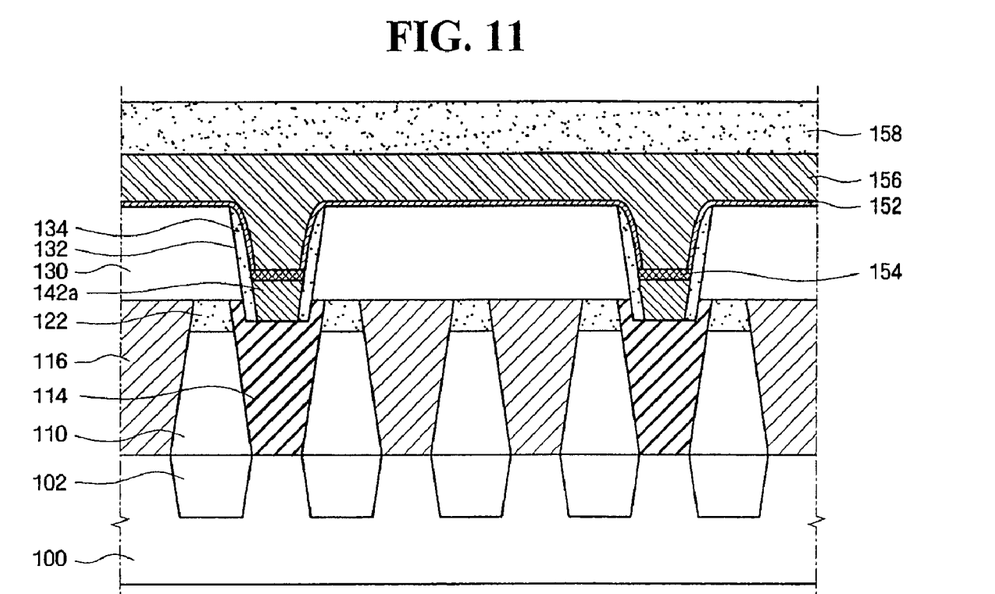

As shown in FIG. 11, the second bit line contact plug 155 (see FIG. 12), which completely fills the bit line contact hole 132, is formed on the metal silicide layer 154. Here, a conductive layer forming the second bit line contact plug 155 may be formed with sufficient thickness so as to reach an upper portion of the second interlayer insulating layer 130, thereby simultaneously forming a bit line conductive layer 156 with the second bit line contact plug 155. The conductive layer forming the second bit line contact plug 155 may be made of, for example, tungsten (W), copper (Cu), aluminum (Al), or the like.

After forming the bit line conductive layer 156, a nitride is deposited on the bit line conductive layer 156 to form the bit line capping layer 158.

Figure 12:
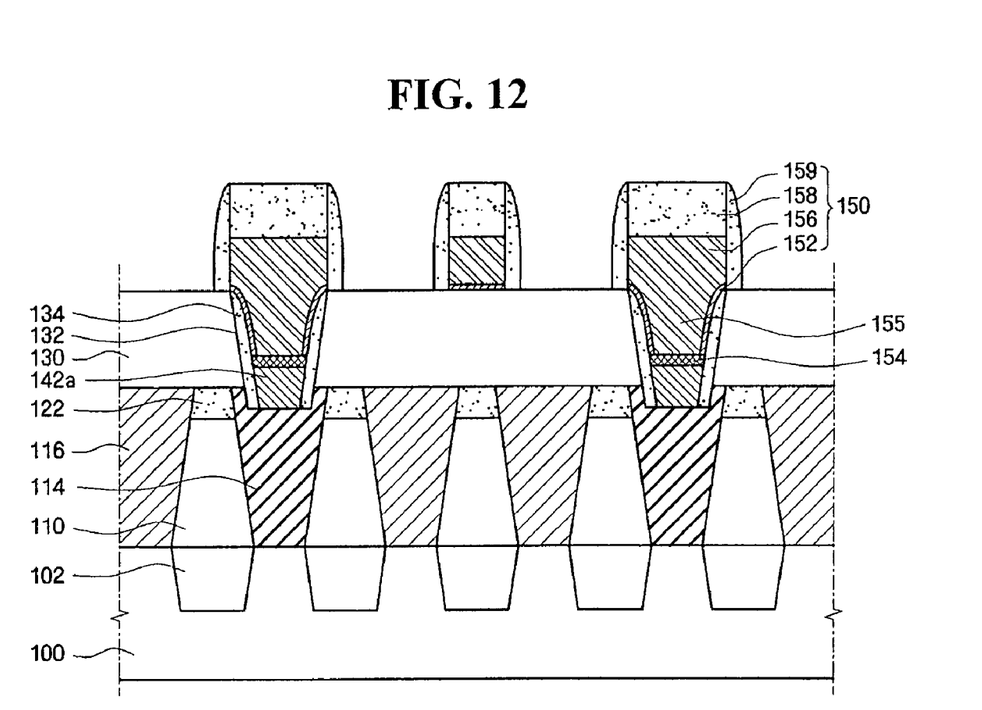

Next, as shown in FIG. 12, the bit lines 150 are formed by patterning the bit line capping layer 158 and the bit line conductive layer 156. The bit lines 150 extend in a direction perpendicular to the underlying gate lines 112 and are electrically connected with the first and second bit line contact plugs 142a and 155. Each of the bit lines 150 includes a bit line spacer 159 formed at sidewalls of the bit line capping layer 158 and the bit line conductive layer 156. After patterning the bit line capping layer 158 and the bit line conductive layer 156, the bit line spacer 159 may be formed by depositing a nitride layer on an entire surface of the resultant structure and performing an etch-back process thereon.

Figure 13:
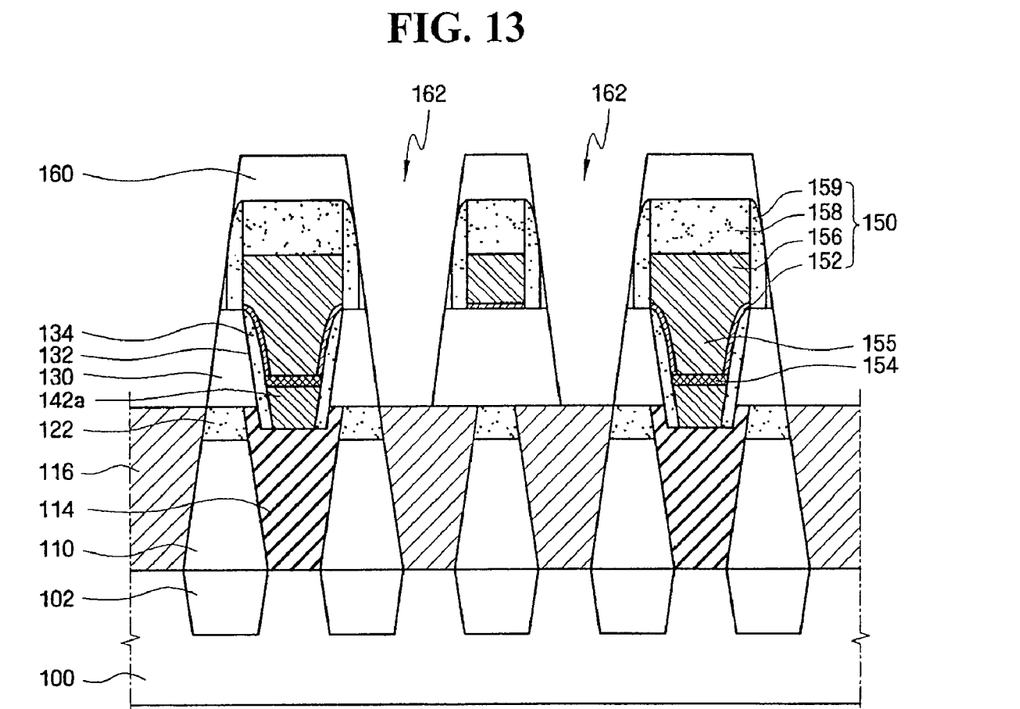

Thereafter, as shown in FIG. 13, the third interlayer insulating layer 160 is formed by depositing an insulating material to fill the entire surface of the resultant structure having the bit lines 150 and planarizing a top surface of the resultant structure. The third interlayer insulating layer 160 may be formed of a silicon oxide based material such as borosilicate glass (BSG), phosphorous silicate glass (PSG), borophosphorous silicate glass (BPSG), plasma enhanced tetraethyl orthosilicate (PE-TEOS), high density plasma (HDP) oxide, or the like.

Then, a mask pattern (not shown) is formed on the third interlayer insulating layer 160 to expose the underlying storage node contact pads 116. Next, the second and third interlayer insulating layers 140 and 160 are etched by a dry etch process using the mask pattern, thereby forming a narrow storage node contact hole 162 exposing a portion of the storage node contact pad 116. Since the storage node contact hole 162 has a large aspect ratio, a width of the storage node contact hole 162 is gradually reduced toward its lower portion.

To increase an exposed area of the storage node contact pad 116, the storage node contact hole 162 is etched by a wet etch process. During the wet etch process, a mixed solution of ammonia ($NH_4OH$), hydrogen peroxide ($H_2O_2$), and deionized (DI) water, or a hydrogen fluoride (HF) solution may be used as an etching solution.

Figure 14:
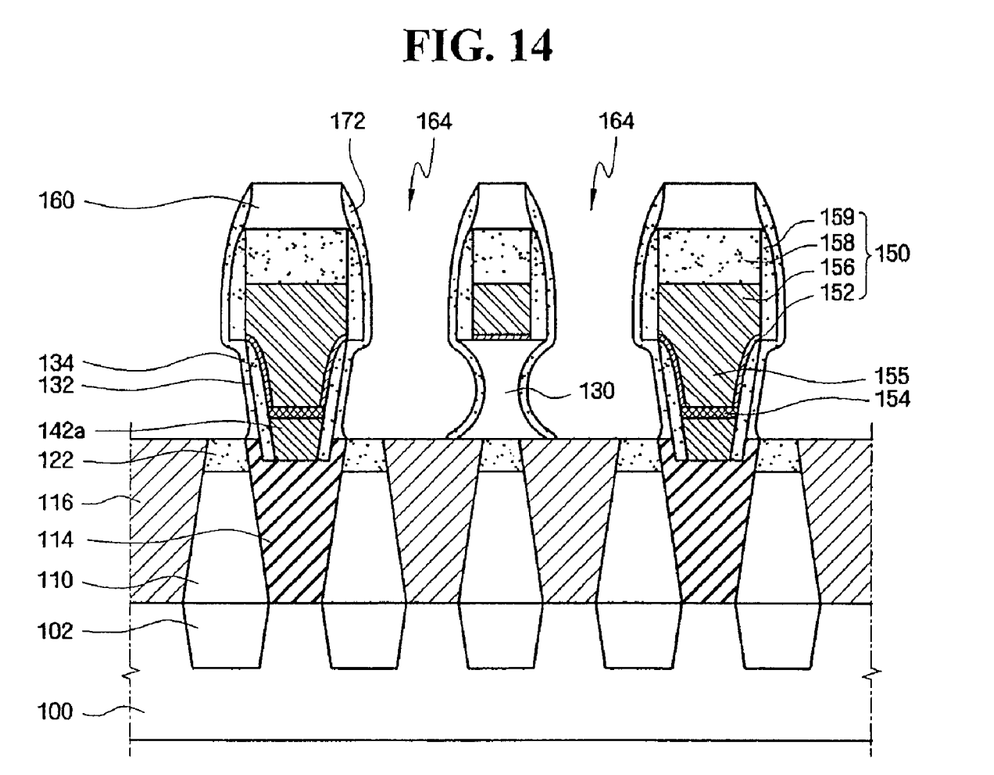

As a result, as shown in FIG. 14, the storage node contact holes 162 expand in the direction of the bit lines 150, thereby forming the expanded storage node contact holes 164. Here, since the bit line contact plug 142a is positioned within the second interlayer insulating layer 130, it can be prevented from becoming damaged due to the etching solution. During formation of the storage node expanded contact hole 164, the top surface of the bit line contact pad 114 for an adjacent bit line may be exposed. However, since the metal silicide layer 154 is formed on the first bit line contact plug 142a and is surrounded by the bit line contact spacer 134, it is possible to prevent the bit line contact spacer 134 from reacting with the etching solution. Accordingly, during formation of the storage node expanded contact hole 164, electric contact failures of the first and second bit line contact plugs 142a and 155, which otherwise may be caused due to the etching solution, can be avoided.

After forming the expanded storage node contact hole 164 as described above, a storage node contact spacer 172 is formed on internal walls of the storage node expanded contact hole 164. In greater detail, a spacer insulating layer is formed conformally on an entire surface of the resultant structure having the expanded storage node contact hole 164. The spacer insulating layer may be formed by depositing silicon nitride to a thickness of about 100 to about 300 Å. Thereafter, the conformally deposited spacer insulating layer is etched back to form the storage node contact spacer 172.

Thereafter, referring back to FIG. 2, the expanded storage node contact hole 164 is filled with a conductive material or a metallic material and planarized, thereby completing the storage node contact plug 180. In such a manner, the resultant storage node contact plug 180 has an increased contact area with the underlying storage node contact pad 116 while preventing the first and second bit line contact plugs 142a and 155 having the metal silicide layer 154 from being damaged.

As described above, according to the present invention, bit line contact plugs partially filling bit line contact holes are formed and a metal silicide layer is formed on the bit line contact plugs, at a position that is at a higher level than adjacent contact pads. In addition, since the metal silicide layer is surrounded by a contact spacer formed on internal walls of the bit line contact holes, it can be protected from damage during subsequent fabrication processes. Accordingly, it is possible to prevent a reaction between the metal silicide layer and an etching solution used in a wet etching process during formation of a storage node expanded contact hole, thereby preventing electric contact failures in the resulting semiconductor device.

While embodiments of the present invention has been particularly shown and described with reference to exemplary embodiments thereof, it will be understood by those of ordinary skill in the art that various changes in form and details may be made herein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a semiconductor device comprising:
    forming a contact pad formed in a first interlayer insulating layer on a semiconductor substrate;
    forming a second interlayer insulating layer on the first interlayer insulating layer;
    forming a contact hole on the second interlayer insulating layer, the contact hole selectively exposing the contact pad;
    forming a contact spacer on internal walls of the contact hole;
    forming a first contact plug connected to the contact pad exposed by the contact hole having the contact spacer formed on the internal walls thereof, the first contact plug partially filling the contact hole;
    forming a metal silicide layer on a surface of the first contact plug; and
    forming a second contact plug formed on the metal silicide layer and partially filling the remaining portion of the contact hole.

2. The method of claim 1, wherein forming the first contact plug comprises performing a selective epitaxial growth (SEG) process on the contact pad exposed by the contact hole having the contact spacer formed on the internal walls thereof.

3. The method of claim 2, wherein forming the first contact plug comprises filling at least 5% of the contact hold.

4. The method of claim 3, wherein the first contact plug is formed to a thickness in a range of about 100 to about 1500 Å.

5. The method of claim 2, wherein the first contact plug is formed of doped polysilicon.

6. The method of claim 1, wherein forming the first contact plug comprises:
    forming a conductive layer on the second interlayer insulating layer, the conductive layer filling the contact hole having the contact spacer formed on internal walls thereof; and
    etching a portion of the conductive layer to allow the portion of the conductive layer to remain in the contact hole having the contact spacer.

7. The method of claim 6, wherein the etching of the portion of the conductive layer comprises performing an anisotropic etching on the conductive layer.

8. The method of claim 6, wherein forming the first contact plug comprises allowing at least 5% of the conductive layer to remain in the contact hole.

9. The method of claim 6, wherein the first contact plug is formed to a thickness in a range of about 100 to about 1500 Å.

10. The method of claim 6, wherein the first contact plug is formed of doped polysilicon.

11. The method of claim 1, wherein forming the metal silicide layer comprises:
    forming a metal barrier layer conformally along the contact hole on the first contact plug; and
    performing an annealing process to form the metal silicide layer.

12. The method of claim 1, wherein forming the second contact plug comprises burying a metal layer on the metal silicide layer.

13. The method of claim 1, wherein the contact spacer is formed of a nitride layer.

14. The method of claim 1, after forming the contact pad, further comprising forming an outer spacer surrounding external walls of an upper portion of the contact pad.

* * * * *